United States Patent
Artur Du Plessis et al.

(10) Patent No.: US 11,768,232 B2
(45) Date of Patent: Sep. 26, 2023

(54) EQUALIZER OVERLOAD MANAGEMENT

(71) Applicant: VOLVO CONSTRUCTION EQUIPMENT AB, Eskilstuna (SE)

(72) Inventors: Grégoire Artur Du Plessis, Greensboro, NC (US); Frederic Leroy, Lyons (FR)

(73) Assignee: VOLVO CONSTRUCTION EQUIPMENT AB, Eskilstuna (SE)

(*) Notice: Subject to any disclaimer, the term of this patent is extended or adjusted under 35 U.S.C. 154(b) by 624 days.

(21) Appl. No.: 16/964,293

(22) PCT Filed: Jan. 25, 2018

(86) PCT No.: PCT/US2018/015223
§ 371 (c)(1),
(2) Date: Jul. 23, 2020

(87) PCT Pub. No.: WO2019/147244
PCT Pub. Date: Aug. 1, 2019

(65) Prior Publication Data
US 2021/0036523 A1 Feb. 4, 2021

(51) Int. Cl.
*H02J 7/00* (2006.01)
*H02J 7/14* (2006.01)
(Continued)

(52) U.S. Cl.
CPC .... *G01R 19/16542* (2013.01); *H01M 10/482* (2013.01); *H02J 7/0013* (2013.01);
(Continued)

(58) Field of Classification Search
CPC .......... G01R 19/16542; H01M 10/482; H01M 2010/4271; H02J 7/0013; H02J 7/0014;
(Continued)

(56) References Cited

U.S. PATENT DOCUMENTS 4,479,083 A * 10/1984 Sullivan ................ H02J 7/0018
320/140
4,723,105 A * 2/1988 Matouka ............... H02J 7/1423
320/140
(Continued)

FOREIGN PATENT DOCUMENTS

CN 204303942 U 4/2015
GB 2545280 A * 6/2017 ............ H02J 7/0016
(Continued)

OTHER PUBLICATIONS

Extended European Search Report, European Patent Application No. 18902303.9, dated Aug. 13, 2021, 8 pages.
(Continued)

*Primary Examiner* — John T Trischler
(74) *Attorney, Agent, or Firm* — Sage Patent Group

(57) ABSTRACT

Provided is a method of operating an electrical system including a first battery, a second battery coupled in series with the first battery, and a battery equalizer coupled to the first battery and the second battery and configured to supply an equalizing current to the first battery. The method includes monitoring a level of the equalizing current, determining, based on monitoring of the level of the equalizing current, that the equalizing current is saturated, and reducing a level of current supplied at a positive terminal of the first battery in response to determining that the equalizing current is saturated. The methods may take an action to reduce the demand for current that is supplied by the first battery.

19 Claims, 9 Drawing Sheets

(51) Int. Cl.
*G01R 19/165* (2006.01)
*H01M 10/48* (2006.01)

(52) U.S. Cl.
CPC .......... *H02J 7/0014* (2013.01); *H02J 7/0016* (2013.01); *H02J 7/0048* (2020.01); *H02J 7/00714* (2020.01); *H02J 7/007194* (2020.01); *H02J 7/1423* (2013.01); *H02J 2310/40* (2020.01)

(58) Field of Classification Search
CPC .... H02J 7/0016; H02J 7/0048; H02J 7/00714; H02J 7/007194; H02J 7/1423; H02J 7/0018; H02J 7/0019; B60L 11/1866; B60L 58/22
USPC .............................................................. 320/116
See application file for complete search history.

(56) References Cited

U.S. PATENT DOCUMENTS

| | | | | |
|---|---|---|---|---|
| 4,816,736 A * | 3/1989 | Dougherty | | H02J 7/1423 322/90 |
| 4,967,136 A * | 10/1990 | Nofzinger | | H02J 7/1423 322/90 |
| 5,493,197 A * | 2/1996 | Eguchi | | H02J 7/0031 320/134 |
| 5,547,775 A * | 8/1996 | Eguchi | | H02J 7/0014 429/61 |
| 5,710,504 A * | 1/1998 | Pascual | | H02J 7/0018 307/77 |
| 5,965,996 A * | 10/1999 | Arledge | | B60L 58/22 320/116 |
| 6,150,795 A * | 11/2000 | Kutkut | | H02J 7/0018 320/118 |
| 6,271,645 B1 * | 8/2001 | Schneider | | B60L 58/12 320/118 |
| 6,275,004 B1 * | 8/2001 | Tamai | | H01M 10/441 903/907 |
| 7,193,392 B2 * | 3/2007 | King | | B60L 58/18 320/118 |
| 7,245,108 B2 * | 7/2007 | Chertok | | B60L 58/18 320/132 |
| 7,378,818 B2 * | 5/2008 | Fowler | | H01M 10/441 320/108 |
| 7,598,706 B2 * | 10/2009 | Koski | | H02J 7/0016 320/128 |
| 7,612,530 B2 * | 11/2009 | Konishi | | H02J 7/0016 320/120 |
| 7,638,974 B2 * | 12/2009 | Maleus | | H02J 7/0049 320/118 |
| 7,688,074 B2 * | 3/2010 | Cox | | G01R 31/36 324/426 |
| 7,745,025 B2 * | 6/2010 | Leach | | H02J 7/00308 320/140 |
| 8,040,110 B2 * | 10/2011 | Al-Anbuky | | H02J 7/0069 320/150 |
| 8,089,247 B2 * | 1/2012 | Pellenc | | H02J 7/0042 320/112 |
| 8,136,454 B2 * | 3/2012 | Barbee | | B61C 5/00 105/49 |
| 8,170,766 B2 * | 5/2012 | Kim | | B60T 8/1708 701/70 |
| 8,183,870 B1 * | 5/2012 | Davies | | H01M 10/4207 323/248 |
| 8,198,862 B2 * | 6/2012 | Zhang | | B60L 58/22 320/118 |
| 8,242,745 B2 * | 8/2012 | Zhang | | B60L 58/22 320/120 |
| 8,342,103 B2 * | 1/2013 | Barbee | | B61C 3/02 320/135 |
| 8,381,852 B2 * | 2/2013 | Zolman | | H04B 7/212 180/65.285 |
| 8,570,047 B1 * | 10/2013 | Davies | | H02J 7/0019 324/426 |
| 8,723,481 B2 * | 5/2014 | Zhang | | H01M 10/441 320/118 |
| 8,896,315 B1 * | 11/2014 | Davies | | H02J 7/0016 320/120 |
| 8,901,884 B2 * | 12/2014 | Maleus | | H02J 7/0014 320/132 |
| 9,007,029 B2 * | 4/2015 | Vuorilehto | | H02J 7/0014 320/132 |
| 9,278,622 B2 * | 3/2016 | Tagaya | | H02J 7/0016 |
| 9,362,544 B2 * | 6/2016 | Kelley | | H02J 7/0047 |
| 9,385,543 B2 * | 7/2016 | Kachi | | B60L 15/2009 |
| 9,397,509 B2 * | 7/2016 | Heidenreich | | H02J 7/0014 |
| 9,403,443 B2 * | 8/2016 | Loftus | | H02J 7/0016 |
| 9,444,272 B2 * | 9/2016 | Bryngelsson | | B60L 58/15 |
| 9,537,332 B2 * | 1/2017 | Cotton | | H02J 7/00712 |
| 10,044,069 B2 * | 8/2018 | Despesse | | H02J 7/0024 |
| 10,151,801 B2 * | 12/2018 | Gelso | | B60L 58/22 |
| 10,574,063 B2 * | 2/2020 | Hellgren | | B60L 58/22 |
| 10,615,610 B1 * | 4/2020 | Jelinek | | H02J 3/381 |
| 10,830,829 B2 * | 11/2020 | Gelso | | G01R 19/16542 |
| 10,910,846 B2 * | 2/2021 | Jelinek | | H02J 3/381 |
| 11,001,213 B2 * | 5/2021 | Salter | | B60R 16/03 |
| 11,101,668 B2 * | 8/2021 | Hidaka | | H02J 7/0016 |
| 11,110,807 B2 * | 9/2021 | Eriksson | | B60L 50/66 |
| 11,128,158 B2 * | 9/2021 | Mulawski | | H02J 7/0047 |
| 11,198,376 B2 * | 12/2021 | Eriksson | | B60L 58/22 |
| 11,332,039 B2 * | 5/2022 | Day | | H02J 7/0031 |
| 11,422,193 B2 * | 8/2022 | Hansen | | H01M 10/482 |
| 11,437,827 B2 * | 9/2022 | Eriksson Normand | | B60L 58/20 |
| 11,520,367 B2 * | 12/2022 | Luoto | | H02J 7/0018 |
| 11,584,257 B2 * | 2/2023 | Valero | | H02J 7/0048 |
| 2004/0135544 A1* | 7/2004 | King | | B60L 58/18 320/116 |
| 2004/0135545 A1* | 7/2004 | Fowler | | H01M 10/441 320/118 |
| 2004/0135546 A1* | 7/2004 | Chertok | | B60L 58/18 320/118 |
| 2004/0222769 A1* | 11/2004 | Al-Anbuky | | H02J 7/0069 320/128 |
| 2005/0024061 A1* | 2/2005 | Cox | | G01R 31/36 324/426 |
| 2006/0192528 A1* | 8/2006 | Maleus | | H02J 7/0049 320/116 |
| 2007/0190369 A1* | 8/2007 | Leach | | H02J 7/0019 429/61 |
| 2008/0116850 A1* | 5/2008 | Konishi | | H02J 7/0016 320/118 |
| 2008/0191663 A1* | 8/2008 | Fowler | | H02J 7/0018 320/118 |
| 2009/0118959 A1* | 5/2009 | Kim | | B60T 8/1708 701/71 |
| 2010/0109610 A1* | 5/2010 | Houldsworth | | H02J 7/0048 320/132 |
| 2010/0275810 A1* | 11/2010 | Barbee | | B61C 5/00 320/136 |
| 2011/0031046 A1* | 2/2011 | Zolman | | H04B 7/212 180/54.1 |
| 2011/0089897 A1* | 4/2011 | Zhang | | H02J 7/0016 320/116 |
| 2011/0140650 A1* | 6/2011 | Zhang | | H02J 7/0016 320/118 |
| 2011/0227537 A1* | 9/2011 | Maleus | | H02J 7/1423 320/116 |
| 2011/0316483 A1* | 12/2011 | Zhang | | H01M 10/486 320/118 |
| 2012/0160124 A1* | 6/2012 | Barbee | | B61C 5/00 105/35 |
| 2012/0177954 A1* | 7/2012 | Houldsworth | | H02J 7/0048 429/7 |
| 2013/0167752 A1* | 7/2013 | Barbee | | B61C 5/00 105/1.4 |
| 2013/0257464 A1* | 10/2013 | Takatsuji | | B60L 53/51 324/705 |

(56) References Cited

U.S. PATENT DOCUMENTS

| | | | | |
|---|---|---|---|---|
| 2014/0015483 | A1* | 1/2014 | Tagaya | H02J 7/0016 320/109 |
| 2014/0015488 | A1* | 1/2014 | Despesse | H01M 10/441 429/7 |
| 2014/0145681 | A1* | 5/2014 | Vuorilehto | H02J 7/0014 320/134 |
| 2014/0184159 | A1* | 7/2014 | Kachi | B60L 7/12 320/109 |
| 2014/0242421 | A1* | 8/2014 | Kelley | H02H 9/042 429/61 |
| 2014/0266003 | A1* | 9/2014 | Biskup | H02J 7/0016 327/306 |
| 2015/0197163 | A1* | 7/2015 | Loftus | H02J 7/0013 320/134 |
| 2015/0295420 | A1* | 10/2015 | Cheng | H02J 7/0016 320/128 |
| 2015/0295425 | A1* | 10/2015 | Bryngelsson | H02J 7/0024 320/126 |
| 2017/0074945 | A1* | 3/2017 | Gelso | H01M 10/482 |
| 2017/0264123 | A1* | 9/2017 | Mulawski | H02J 9/062 |
| 2018/0106869 | A1* | 4/2018 | Gelso | G01R 31/396 |
| 2018/0358819 | A1* | 12/2018 | Hellgren | B60L 58/22 |
| 2019/0089167 | A1* | 3/2019 | Normand | B60L 58/20 |
| 2019/0280489 | A1* | 9/2019 | Hidaka | H02J 7/0048 |
| 2019/0283625 | A1* | 9/2019 | Eriksson | B60L 58/22 |
| 2019/0356158 | A1* | 11/2019 | Luoto | H01M 10/441 |
| 2019/0393696 | A1* | 12/2019 | Tada | H02H 7/18 |
| 2020/0079240 | A1* | 3/2020 | Lee | H02J 7/0014 |
| 2020/0353823 | A1* | 11/2020 | Eriksson | B60L 53/24 |
| 2020/0381925 | A1* | 12/2020 | Jelinek | H02J 3/381 |
| 2020/0403422 | A1* | 12/2020 | Bah | H02J 7/34 |
| 2020/0403428 | A1* | 12/2020 | Bah | H01M 10/441 |
| 2020/0412136 | A1* | 12/2020 | Kristjansson | G06F 1/28 |
| 2021/0009007 | A1* | 1/2021 | Day | B60L 58/22 |
| 2021/0016729 | A1* | 1/2021 | Salter | B60R 16/033 |
| 2021/0017944 | A1* | 1/2021 | Artur Du Plessis | F02N 11/0866 |
| 2021/0055355 | A1* | 2/2021 | Gelso | G01R 19/16542 |
| 2021/0148980 | A1* | 5/2021 | Hansen | G01R 31/396 |
| 2021/0197745 | A1* | 7/2021 | Salter | B60R 16/033 |
| 2021/0249949 | A1* | 8/2021 | Leroy | H02M 1/40 |
| 2021/0305817 | A1* | 9/2021 | Hidaka | H02J 7/0016 |
| 2022/0037703 | A1* | 2/2022 | Forssell | H02J 7/0013 |
| 2022/0037704 | A1* | 2/2022 | Forssell | H02J 7/1423 |
| 2022/0037902 | A1* | 2/2022 | Forssell | B60L 50/66 |
| 2022/0105831 | A1* | 4/2022 | Valero | B60L 58/20 |
| 2022/0166227 | A1* | 5/2022 | Morikawa | H01M 10/48 |
| 2022/0216705 | A1* | 7/2022 | Fogelberg | H02J 7/00302 |
| 2022/0242276 | A1* | 8/2022 | Day | B60L 58/21 |
| 2022/0278529 | A1* | 9/2022 | Gannamaneni | B60L 58/22 |
| 2022/0311067 | A1* | 9/2022 | Nedjimi | G01R 31/392 |
| 2022/0349959 | A1* | 11/2022 | Leroy | H01H 85/30 |
| 2023/0010979 | A1* | 1/2023 | Maitre | B60L 58/12 |

FOREIGN PATENT DOCUMENTS

| | | |
|---|---|---|
| GB | 2548631 A | 9/2017 |
| WO | WO 2017/026964 A1 | 2/2017 |

OTHER PUBLICATIONS

International Search Report and Written Opinion of the International Searching Authority, PCT/US2018/015223, dated Apr. 30, 2018, 14 pages.

* cited by examiner

US 11,768,232 B2

EQUALIZER OVERLOAD MANAGEMENT

CROSS REFERENCE TO RELATED APPLICATIONS

This application is a 35 U.S.C. § 371 national stage application of PCT International Application No. PCT/US2018/015223 filed on Jan. 25, 2018, the disclosure and content of which is incorporated by reference herein in its entirety.

FIELD

The inventive concepts relate to vehicle electrical systems, and in particular to dual voltage battery systems for vehicles.

BACKGROUND

Some vehicles, including heavy construction vehicles, may include 24 volt (24V) electrical systems for powering various loads in the vehicle. A 24V vehicle electrical system is illustrated in FIG. 9A. As shown therein, the electrical system includes first and second 12 volt (12V) batteries, namely, a lower battery and an upper battery, arranged in series to provide a total of 24 volts for powering 24V loads. In this arrangement, the batteries are referred to as the "lower battery" and the "upper battery," because the positive terminal of the upper battery is at a higher electric potential than the positive terminal of the lower battery. Thus, 24V loads can be powered from the positive terminal of the upper battery, while 12V loads can be powered from the positive terminal of the lower battery. When the engine of the vehicle is running, the batteries are charged by a 24V alternator that is connected across both batteries.

When the alternator is off, power is supplied to both the 12V and 24V loads from the batteries alone. That is, the lower battery supplies power to both 12V loads and 24V loads, while the upper battery only supplies power to 24V loads. As a result, when both 12V and 24V loads are present, the lower battery may discharge faster than the upper battery. Thus, after a discharge cycle, the lower battery may be more significantly discharged than the upper battery.

When the alternator begins to run, the alternator supplies current to the positive terminal of the upper battery. Charging current supplied by the alternator charges the upper battery and the lower battery. Charging will continue until the sum of charge on the batteries is equal to 24V. Since the charge on the batteries is unequal, this may cause the upper battery to overcharge and become permanently damaged. Meanwhile, the lower battery may not become fully charged, making it susceptible to electrode damage caused by undercharging. Either of these situations may reduce the battery life of the upper and/or lower battery and may lead to a failure in the electrical system.

To address these problems, a battery equalizer may be provided. Referring to FIG. 9B, a battery equalizer connects to all three terminals of the series connection of the batteries, i.e., the negative terminal of the lower battery, the positive terminal of the upper battery and the intermediate node between the positive terminal of the lower battery and the negative terminal of the upper battery.

During a discharge cycle (when the alternator is off), the battery equalizer may sense that the lower battery is discharging more quickly than the upper battery because the lower battery is supplying both 24V and 12V loads. The battery equalizer then diverts power from the upper battery to help supply the 12V loads so that the demand being placed on both batteries is equal, with the result that both batteries discharge equally.

The battery equalizer operates in a similar manner during a charging cycle (when the alternator is running), except that the power being diverted to the 12V load is coming from the alternator. When the alternator begins charging and supplying power for the 12V and 24V loads, the battery equalizer may sense an imbalance between the charge voltage applied to the lower battery and the charge voltage applied to upper battery. In that case, the battery equalizer may redirect some of the power coming from the alternator so that the charge voltages being applied across both batteries are equal.

SUMMARY

One embodiment of the inventive concepts is directed to a method of operating an electrical system including a first 12V battery, a second 12V battery coupled in series with the first 12V battery, and a battery equalizer coupled to the first 12V battery and the second 12V battery and configured to supply an equalizing current to the first 12V battery. The method includes monitoring a level of the equalizing current, determining, based on monitoring of the level of the equalizing current, that the equalizing current is saturated, and reducing a level of 12V current supplied to a load at a positive terminal of the first 12V battery in response to determining that the equalizing current is saturated.

A vehicle electrical system according to one embodiment includes a first 12V battery, a second 12V battery coupled in series with the first 12V battery, and a battery equalizer coupled to the first 12V battery and the second 12V battery. The battery equalizer is configured to supply an equalizing current to the first 12V battery. The vehicle electrical system further includes an electrical control unit including a microcontroller programmed to perform operations including monitoring a level of the equalizing current, determining, based on monitoring of the level of the equalizing current, that the equalizing current is saturated, and reducing a level of 12V current supplied to the load at a positive terminal of the first 12V battery in response to determining that the equalizing current is saturated.

A vehicle electrical system according to a further embodiment includes a first 12V battery having a positive terminal and a negative terminal and configured to supply power to a 12V subsystem of a vehicle from the positive terminal of the first 12V battery, a second 12V battery having a negative terminal coupled to the positive terminal of the first 12V battery and having a positive terminal and being configured, in combination with the first 12V battery, to supply power to a 24V subsystem of the vehicle from the positive terminal of the second 12V battery, and a battery equalizer coupled to the positive terminal and negative terminal of the first 12V battery and to the positive terminal and negative terminal of the second 12V battery. The battery equalizer is configured to supply an equalizing current to the positive terminal of the first 12V battery in response to detecting a charge imbalance between the first 12V battery and the second 12V battery. The vehicle electrical system further includes an electrical control unit including a microcontroller programmed to perform operations including monitoring a level of the equalizing current supplied to the positive terminal of the first 12V battery, determining, based on monitoring of the level of the equalizing current, that the equalizing current is saturated and that at least one of (a) a state of charge of the first 12V battery is below a first threshold or (b) a difference in state of charge of the first 12V battery and the second 12V battery is greater than a second threshold, and reducing a level of 12V current supplied to the 12V subsystem at the positive terminal of the first 12V battery in response to the determination.

Other systems/methods for battery equalizer management will be or become apparent to one with skill in the art upon review of the following drawings and shall be included within this description and protected by the accompanying claims. Moreover, it is intended that all embodiments disclosed herein can be implemented separately or combined in any way and/or combination unless expressly excluded.

ASPECTS

According to one aspect, a method of operating an electrical system including a first 12V battery, a second 12V battery coupled in series with the first 12V battery, and a battery equalizer coupled to the first 12V battery and the second 12V battery and configured to supply an equalizing current to the first 12V battery. The method includes monitoring a level of the equalizing current, determining, based on monitoring of the level of the equalizing current, that the equalizing current is saturated, and reducing a level of 12V current supplied to a load at a positive terminal of the first 12V battery in response to determining that the equalizing current is saturated.

According to one aspect, the method may further include monitoring a state of charge of the first 12V battery, and determining that the state of charge of the first 12V battery is below a threshold charge level. Reducing the level of 12V current supplied to the load at the positive terminal of the first 12V battery may be performed in response to determining that the equalizing current is saturated and that the state of charge of the first 12V battery is below the threshold charge level.

According to one aspect, the method may further include monitoring a state of charge of the first 12V battery, determining a difference in state of charge between the first 12V battery and the second 12V battery, and determining if the difference in state of charge between the first 12V battery and the second 12V battery is greater than a threshold state of charge difference. Reducing the level of 12V current supplied to the load at the positive terminal of the first 12V battery may be performed in response to determining that the difference in state of charge between the first 12V battery and the second 12V battery is greater than the threshold state of charge difference.

According to one aspect, the method may further include measuring a temperature of the first 12V battery and/or a temperature of the second 12V battery, and setting the threshold state of charge difference based on the temperature of the first 12V battery and/or a temperature of the second 12V battery.

According to one aspect, the method may further include determining a length of time for which the equalizing current is saturated. Reducing the level of 12V current supplied to the load at the positive terminal of the first 12V battery may be additionally performed based on the length of time for which the equalizing current is saturated.

According to one aspect, the method may further include receiving an equalizer diagnostic signal from the battery equalizer. The equalizer diagnostic signal provides the level of the equalizing current.

According to one aspect, reducing the level of 12V current supplied at the positive terminal of the first 12V battery may include disabling at least one 12V system powered by the electrical system.

According to one aspect, the method may further include filtering the level of the equalizing current before determining that the equalizing current is saturated.

According to one aspect, the electrical system may further include an alternator configured to supply a charging current at a positive terminal of the second 12V battery, and the method may further include determining that the alternator is currently supplying charging current to the second 12V battery, and reducing a voltage output by the alternator to the positive terminal of the second 12V battery in response to determining that the equalizing current is saturated.

According to a further aspect, a vehicle electrical system includes a first 12V battery, a second 12V battery coupled in series with the first 12V battery, and a battery equalizer coupled to the first 12V battery and the second 12V battery. The battery equalizer is configured to supply an equalizing current to the first 12V battery. The vehicle electrical system further includes an electrical control unit including a microcontroller programmed to perform operations including monitoring a level of the equalizing current, determining, based on monitoring of the level of the equalizing current, that the equalizing current is saturated, and reducing a level of 12V current supplied to a load at a positive terminal of the first 12V battery in response to determining that the equalizing current is saturated.

According to one aspect, the controller may be further programmed to perform operations including monitoring a state of charge of the first 12V battery, and determining that the state of charge of the first 12V battery is below a threshold charge level. Reducing the level of 12V current supplied to the load at the positive terminal of the first 12V battery may be performed in response to determining that the equalizing current is saturated and that the state of charge of the first 12V battery is below the threshold charge level.

According to one aspect, the controller may be further programmed to perform operations including monitoring a state of charge of the first 12V battery, determining a difference in state of charge between the first 12V battery and the second 12V battery, and determining if the difference in state of charge between the first 12V battery and the second 12V battery is greater than a threshold state of charge difference. Reducing the level of 12V current supplied to the load at the positive terminal of the first 12V battery may be performed in response to determining that the difference in state of charge between the first 12V battery and the second 12V battery is greater than the threshold state of charge difference.

According to one aspect, the controller may be further programmed to perform operations including measuring a temperature of the first 12V battery and/or a temperature of the second 12V battery, and setting the threshold state of charge difference based on the temperature of the first 12V battery and/or a temperature of the second 12V battery.

According to one aspect, the controller may be further programmed to perform operations including determining a length of time for which the equalizing current is saturated. Reducing the level of 12V current supplied to the load at the positive terminal of the first 12V battery may be additionally performed based on the length of time for which the equalizing current is saturated.

According to one aspect, the controller may be further programmed to perform operations including receiving an equalizer diagnostic signal from the battery equalizer. The equalizer diagnostic signal provides the level of the equalizing current.

According to one aspect, the controller may be further programmed to perform operations including filtering the level of the equalizing current before determining that the equalizing current is saturated.

According to one aspect, the vehicle electrical system may further include an alternator configured to supply a charging current at a positive terminal of the second 12V battery. The controller may be further programmed to perform operations including determining that the alternator is currently supplying charging current to the second 12V battery, and reducing supplied voltage level output by the alternator to the positive terminal of the second 12V battery in response to determining that the equalizing current is saturated.

According to one aspect, a vehicle electrical system includes a first 12V battery having a positive terminal and a negative terminal and configured to supply power to a 12V subsystem of a vehicle from the positive terminal of the first 12V battery, a second 12V battery having a negative terminal coupled to the positive terminal of the first 12V battery and having a positive terminal and being configured, in combination with the first 12V battery, to supply power to a 24V subsystem of the vehicle from the positive terminal of the second 12V battery, and a battery equalizer coupled to the positive terminal and negative terminal of the first 12V battery and to the positive terminal and negative terminal of the second 12V battery. The battery equalizer is configured to supply an equalizing current to the positive terminal of the first 12V battery in response to detecting a charge imbalance between the first 12V battery and the second 12V battery. The vehicle electrical system further includes an electrical control unit including a microcontroller programmed to perform operations including monitoring a level of the equalizing current supplied to the positive terminal of the first 12V battery, determining, based on monitoring of the level of the equalizing current, that the equalizing current is saturated and that at least one of (a) a state of charge of the first 12V battery is below a first threshold or (b) a difference in state of charge of the first 12V battery and the second 12V battery is greater than a second threshold, and reducing a level of 12V current supplied to the 12V subsystem at the positive terminal of the first 12V battery in response to the determination.

BRIEF DESCRIPTION OF THE DRAWINGS

The accompanying drawings, which are included to provide a further understanding of the disclosure and are incorporated in and constitute a part of this application, illustrate certain non-limiting embodiments of inventive concepts. In the drawings.

DETAILED DESCRIPTION OF EMBODIMENTS

Although battery equalizers are useful for helping to balance the charging and discharging of series connected batteries in dual voltage electrical systems as described above, situations may arise in which the battery equalizer saturates and is not able to supply sufficient current to one of the batteries. When the battery equalizer saturates, it may not be able to supply a sufficient level of current to the lower battery to maintain an equal state of charge on both the lower battery and the upper battery in a dual voltage electrical system. As noted above, when the lower battery discharges at a faster rate than the upper battery in a dual voltage system, the upper battery may become overcharged and/or the lower battery may undercharged during a subsequent charging cycle, which may reduce the lifetime of the battery system and may in some cases lead to loss of the 12V system.

Some embodiments address one or more of the issues described above by providing an equalizer management system that monitors equalizer current to reduce/avoid equalizer saturation in a dual voltage battery system. In one aspect, the equalizer management system monitors the equalizer system and determines that the equalizer current supplied to the lower battery is saturated or nearly saturated, and takes a remedial action to reduce the demand for 12V current that is sourced by the lower battery in response to determining that the equalizer current supplied to the lower battery is saturated or nearly saturated. The actions that may be taken in response to determining that the equalizer current supplied to the lower battery is saturated or nearly saturated may include, for example, alerting a user of the vehicle to reduce 12V loads and/or start the engine in order to turn the alternator on, automatically start the engine, increase engine revolutions per minute (RPMs), increasing or decreasing the voltage output by the alternator, automatically disable non-critical 12V loads, such as non-safety related 12V loads, etc.

As used herein, "saturation" refers to the condition in which a battery equalizer is delivering an equalizing current that is at or near its maximum rated equalizing current. When the battery equalizer is saturated, then even in the event of charge imbalance between the upper and lower batteries, the equalizer may not be able to deliver additional equalizing current to overcome the imbalance. In some cases, a battery equalizer may be determined to be saturated when the battery equalizer is delivering 95% of its maximum rated current. In some cases, a battery equalizer may be determined to be saturated when the battery equalizer is delivering 98% of its maximum rated current. In some cases, a battery equalizer may be determined to be saturated when the battery equalizer is delivering 99% or more of its maximum rated current.

Figure 1:
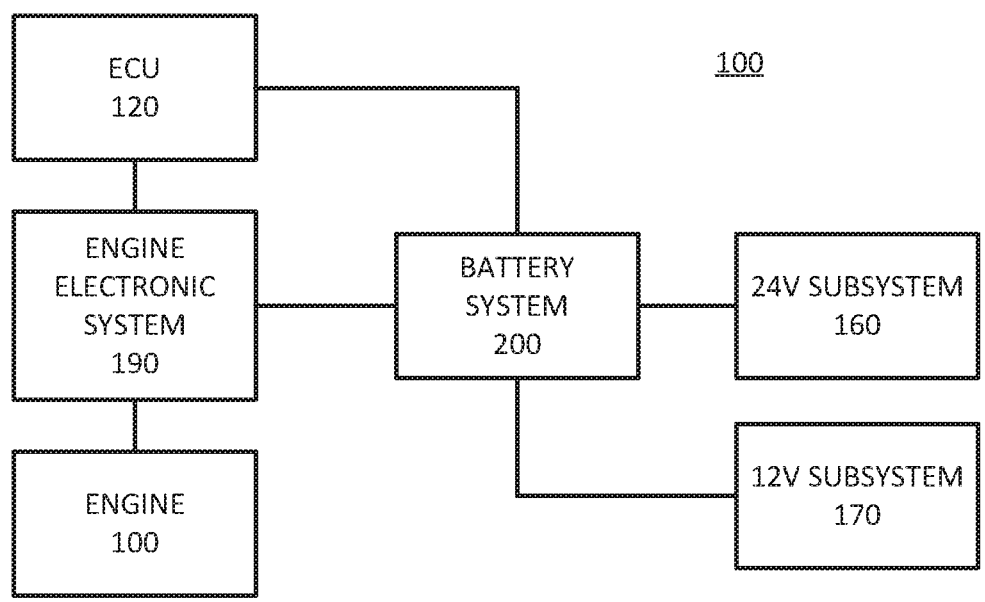
FIG. 1 is a block diagram of a dual voltage vehicle electrical system according to some embodiments of the inventive concepts.

Reference is made to FIG. 1, which is a block diagram of a dual-voltage vehicle electrical system 100 in which embodiments of the inventive concepts may be employed. The vehicle electrical system 100 generally includes an engine electronic system 190 coupled to an engine 100 and a battery system 200. The battery system 200 powers a 24V subsystem 160 including one or more 24V loads and a 12V subsystem including one or more 12V loads. One or more electronic control units (ECU), such as, for example ECUs 115 and 120 monitors and controls the operation of the engine electronic system 190 and the battery system 200.

Figure 2:
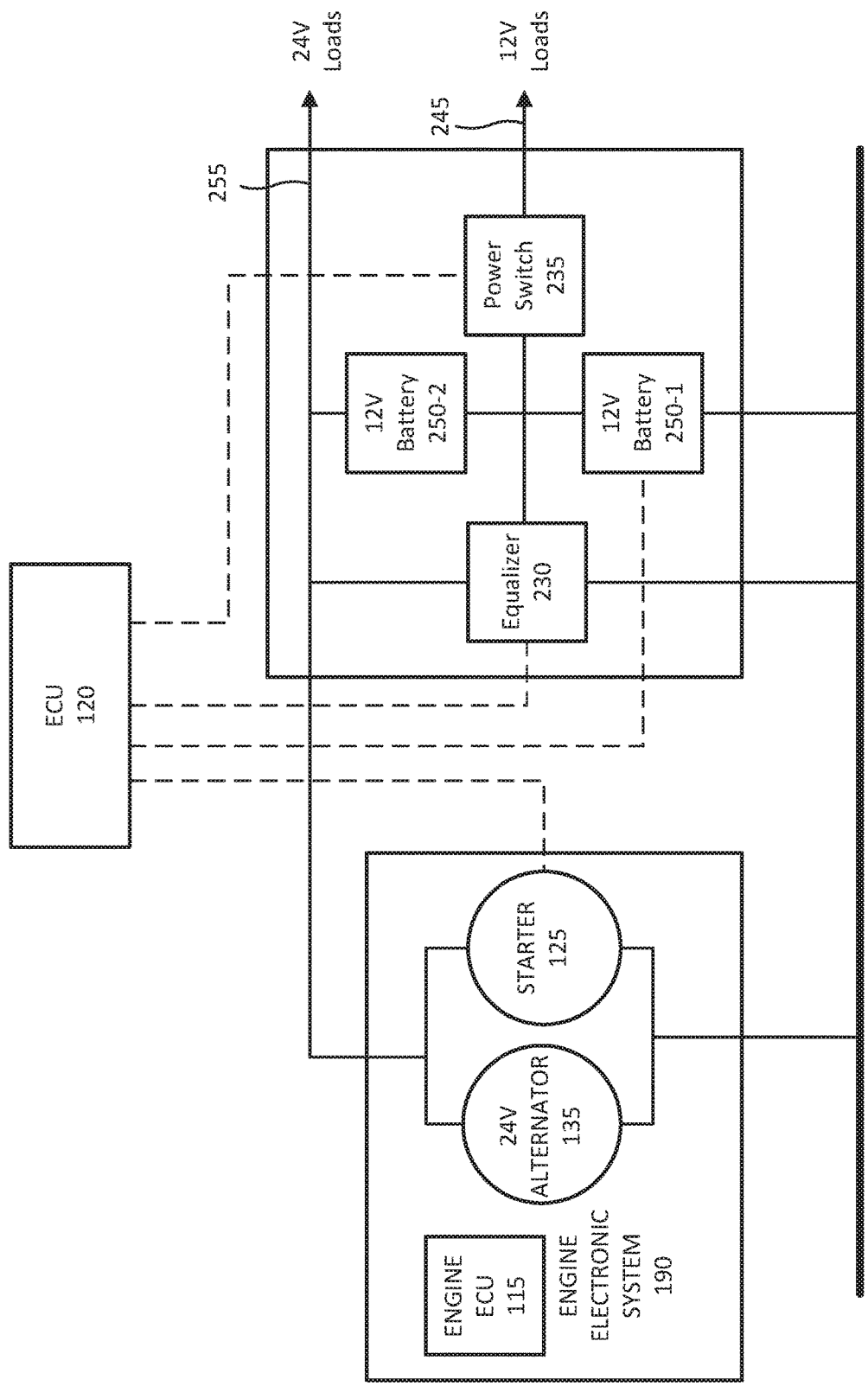
FIG. 2 is a block diagram of a dual voltage vehicle electrical system according to some embodiments of the inventive concepts.

FIG. 2 is a block diagram illustrating certain components of the vehicle electrical system 100 in greater detail. As shown therein, the engine electronic system 190 includes a 24V alternator 135 and a starter 125. As shown, an ECU 115 controls operation of the 24V alternator 135 and the starter 125. For example, the engine ECU 115 may adjust the voltage regulation of the starter 135, control timing of the ignition signal, etc. The engine ECU 115 may be provided separately from or integrated with the ECU 120. The alternator 135 and the starter 125 may be coupled to and controlled by signals from the ECU 120.

Still referring to FIG. 2, the battery system 200 is configured to supply power to both 24V loads and 12V loads. The battery system 200 includes a first (lower) battery 250-1 and a second (upper) battery 250-2 connected in series. The upper and lower batteries 250-1, 250-2 are arranged to provide 12V power to 12V loads via a 12V supply line 245 and to provide 24V power to 24V loads via a 24V supply line 255.

A battery equalizer 230 is coupled to the lower battery 250-1 and the upper battery 250-2. A power switch 235 is coupled to the 12V supply line and to the ECU 120. The power switch 235 is operable to connect/disconnect the 12V load(s) to/from the 12V supply line 245 in response to a control signal from the ECU 120.

The ECU 120 measures an equalizing current supplied by the battery equalizer 230. If the ECU 120 determines that the equalizing current has saturated, the ECU 120 may take action to protect the battery system 200. In some embodiments, the ECU 120 may cause the power switch 235 to disconnect the 12V loads from the battery system 200 to prevent damage caused by charge imbalance between the lower battery 250-1 and the upper battery 250-2.

Figure 4:
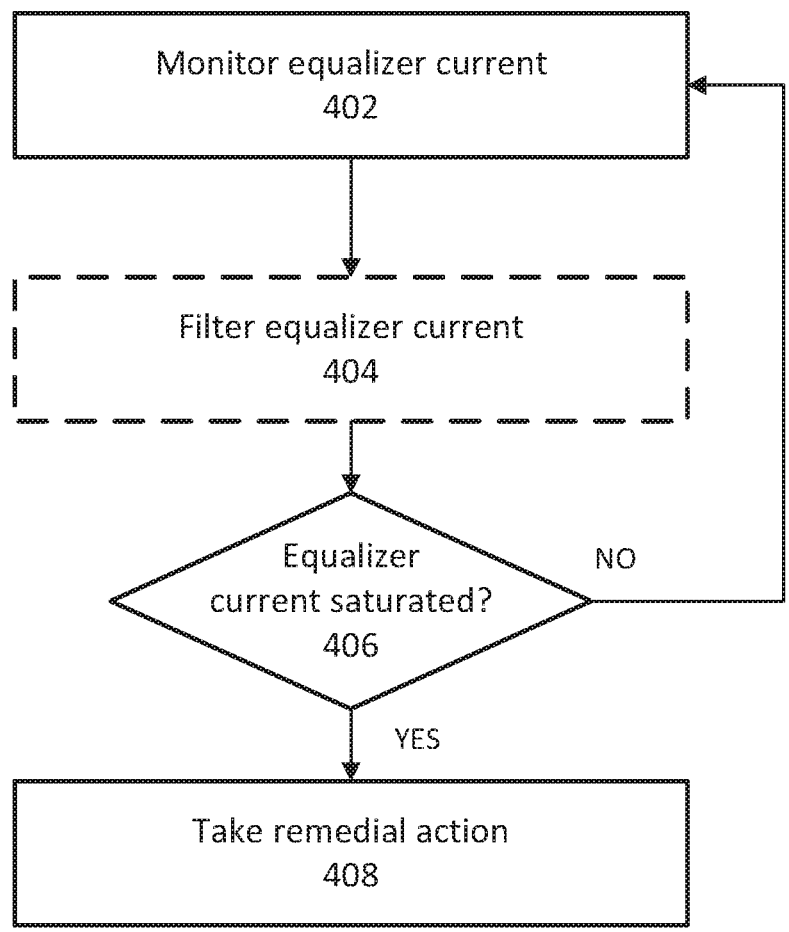
FIGS. 4 to 7 are block diagrams illustrating operations of systems/methods according to some embodiments of the inventive concepts.

Accordingly, referring to the flowchart of FIG. 4, a method of operating a vehicle electrical system including a first 12V battery, a second 12V battery coupled in series with the first 12V battery, and a battery equalizer coupled to the first 12V battery and the second 12V battery and configured to supply an equalizing current to the first 12V battery is illustrated. The method includes monitoring a level of the equalizing current supplied by the battery equalizer to the battery system (block 402). The method includes determining, based on monitoring of the level of the equalizing current, that the equalizing current is saturated (block 406), and taking a remedial action in response to determining that the equalizing current is saturated. Determining if the equalizing current is saturated may involve comparing a measurement of the equalizing current to a threshold. If the equalizing current is greater than a threshold level, the equalizing current may be deemed to be saturated. The saturation determination may also be based on how long the equalizing current remains above the threshold. The saturation determination may also be based on battery voltage of the first 12V battery and/or the second 12V battery. In some embodiments, the remedial action includes reducing a level of 12V current supplied at a positive terminal of the first 12V battery in response to determining that the equalizing current is saturated.

Optionally, the equalizer current measurement may be filtered (block 404), such as using a low pass filter, to smooth out the equalizer current measurement to ensure that remedial action is not taken in response to a transient change in the equalizing current.

The operations illustrated in FIG. 4 may be performed in some embodiments by the ECU 120 (FIG. 2). In that case, the ECU 120 also acts as an equalizer monitoring unit. However, it will be appreciated that the operations may be performed by any suitably configured digital or analog controller, and that a separate equalizer monitoring unit may be provided.

Figure 3:
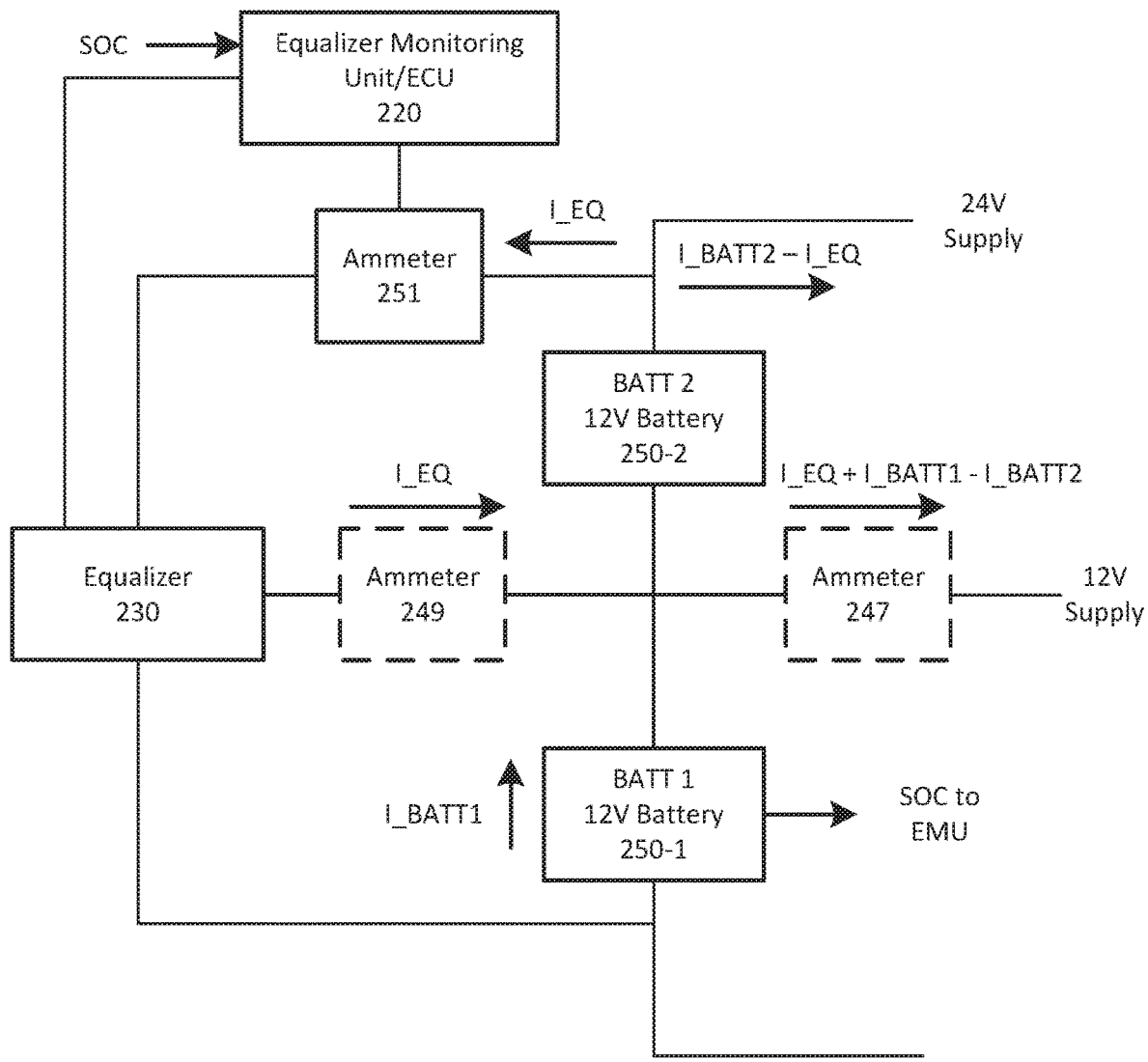
FIG. 3 is a block diagram of a dual voltage battery subsystem of a vehicle electrical system according to some embodiments of the inventive concepts.

FIG. 3 is a more detailed block diagram illustration of the battery system 200 of FIG. 2. Referring to FIG. 3, an equalizer monitoring unit (EMU) 220 is provided. The equalizer monitoring unit 220 is coupled to an ammeter 251 which measures an equalizing current I_EQ drawn by the equalizer 230 from the positive terminal of the upper battery 250-2 and supplied to the positive terminal of the lower battery 250-1. A measurement signal generated by the ammeter 225 is provided to the ECU 120. In some embodiments, the state of charge (SOC) of the lower battery 250-1 and the upper battery 250-2 are also provided to the equalizer monitoring unit 220.

In FIG. 3, the current flowing through the lower battery is denoted I_BATT1, while the current flowing through the upper battery is denoted I_BATT2. The voltage across the lower battery is denoted V1, while the voltage across the upper battery is denoted V2. The equalizing current I_EQ is added to the 12V current supplied by the lower battery 250-1 (I_BATT1-I_BATT2). Current supplied to the 12V loads may be measured by an optional ammeter 247. Moreover, the equalizing current supplied by the equalizer 230 may be measured by an optional ammeter 249. The equalizer 230 may be capable of supplying both current information, such as the level of I_EQ as well as state of charge (SOC) information to the equalizer monitoring unit 220.

Figure 5:
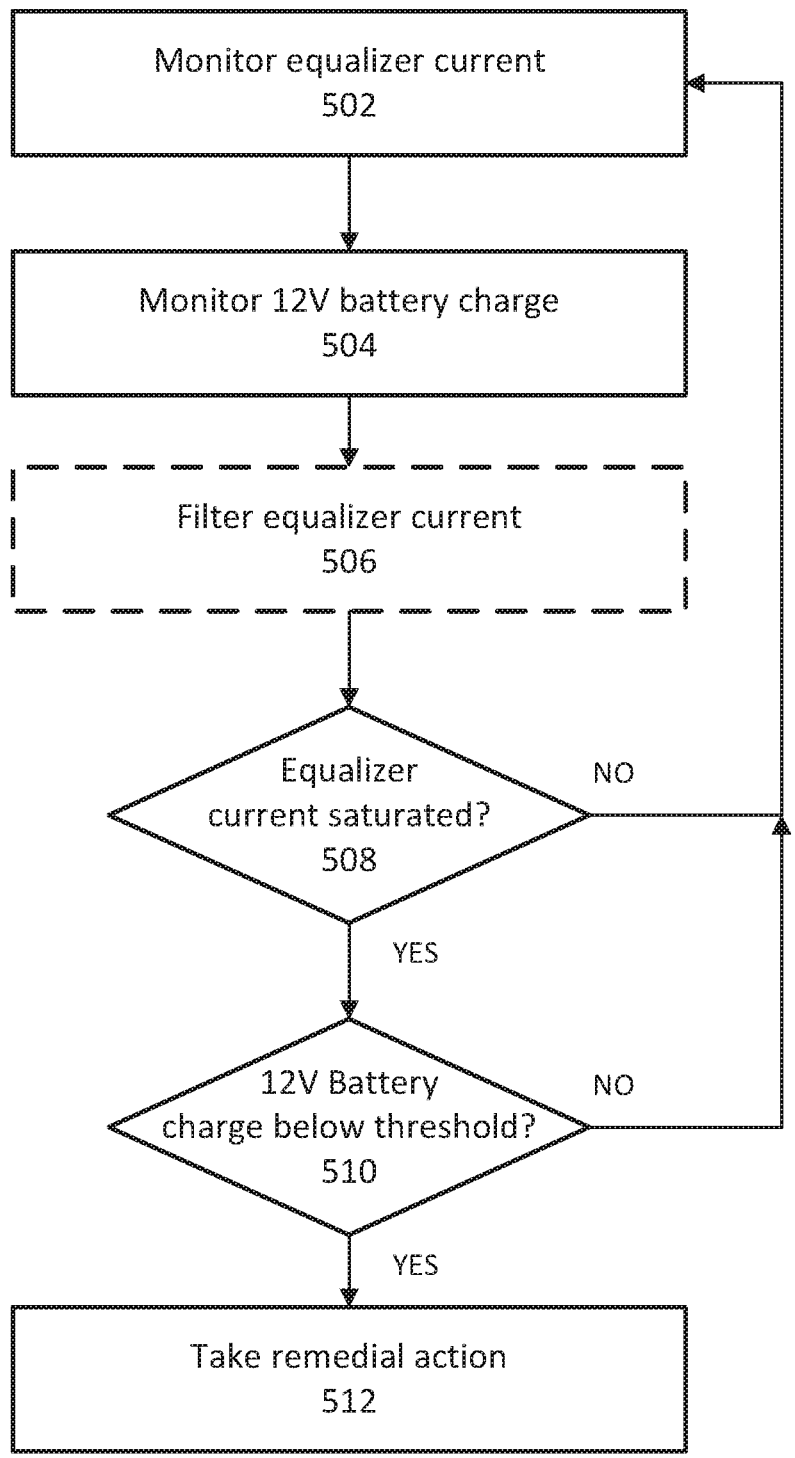

Operations of an EMU 220 according to further embodiments are illustrated in FIG. 5. As shown therein, according to some embodiments, the EMU 220 may monitor the equalizing current supplied by the equalizer 230 (block 502) and monitors a state of charge of the first battery 250-1 (block 504). The EMU may also monitor the voltage across the first battery 250-1 and/or the voltage across the second battery 250-2. The EMU 220 may optionally filter the equalizing current measurement (block 506). The EMU 220 checks to see if the equalizing current is saturated (block 508), and if so, the EMU 220 compares the state of charge of the lower battery 250-1 to a threshold charge level (block 510). If the EMU 220 determines that state of charge of the lower battery 250-1 is below the threshold charge level and the equalizing current is saturated, the EMU 220 may take remedial action (block 512), such as by reducing the level of 12V current supplied at the positive terminal of the lower 12V battery. Accordingly, in these embodiments, the EMU 220 may not take remedial action even if the equalizing current is determined to be saturated unless the state of charge on the lower battery 250-1 drops by a sufficient amount, e.g., below some threshold level.

In some embodiments, the level of 12V current supplied at the positive terminal of the lower battery 250-1 may include disabling at least one 12V system powered by the electrical system. It will be appreciated that the level of 12V current supplied may be reduced in other ways, such as alerting a user of the vehicle in which the dual voltage electrical system is installed to reduce 12V loads and/or start the engine in order to turn the alternator on, automatically starting the engine to turn the alternator on, increasing or decreasing engine revolutions per minute (RPMs) to increase or decrease the voltage supplied by the alternator, directly controlling the voltage output by the alternator, etc.

In some embodiments, the EMU 220 may obtain a measurement of a temperature of the lower battery 250-1 and/or a temperature of the upper battery 250-2. The threshold state of charge difference may be set based on the temperature of the lower battery 250-1 and/or a temperature of the upper battery 250-2.

Figure 6:
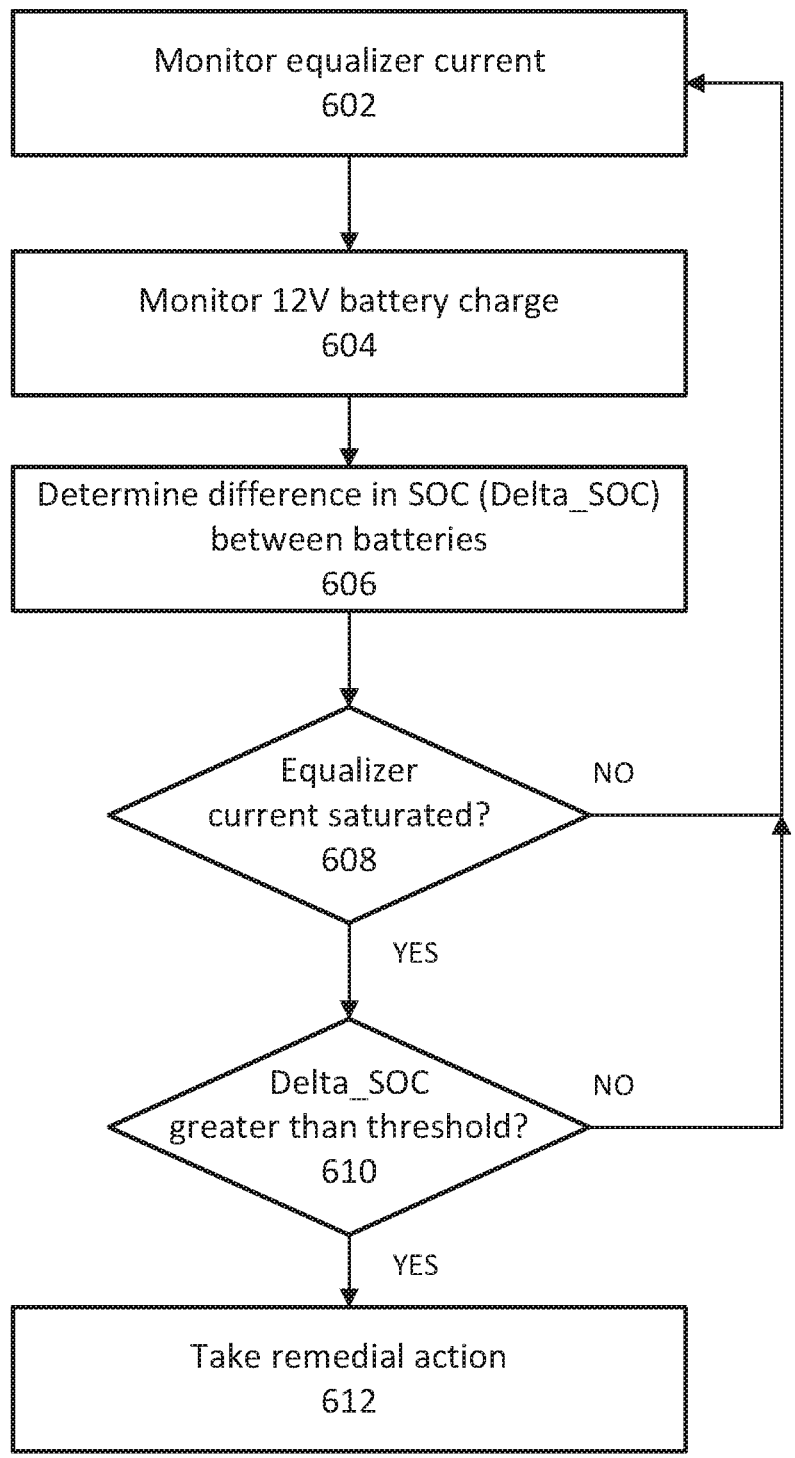

Still further embodiments are illustrated in the flowchart of FIG. 6. As shown therein, the method may include monitoring the equalizing current (block 602), and monitoring a state of charge of the lower battery 250-1 and the upper battery 250-2 (block 604). In some embodiments, the EMU 220 may determine a difference in state of charge (Delta_SOC) between the lower battery 250-1 and the upper battery 250-2 (block 606). The EMU 220 determines if the equalizing current is saturated (block 608), and if so, proceeds to determining if the difference in state of charge Delta_SOC between the lower battery 250-1 and the upper battery 250-2 is greater than a threshold state of charge difference (block 610). If the difference in state of charge between the two batteries is greater than the threshold, the EMU 220 may take remedial action (block 612), such as by reducing the level of 12V current supplied at the positive terminal of the lower battery 250-1.

Figure 7:
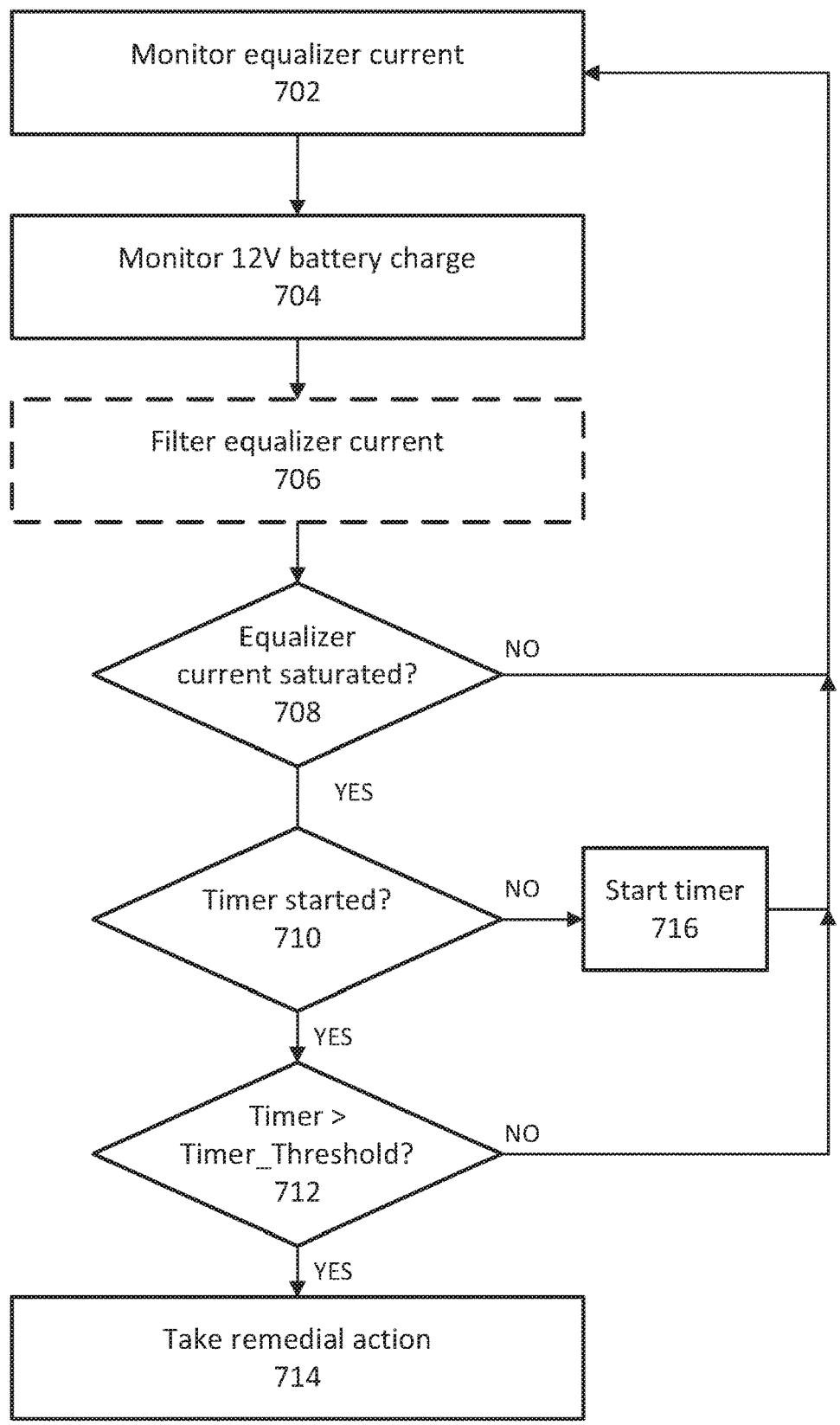

Still further embodiments are illustrated in the flowchart of FIG. 7. As shown therein, the method may include monitoring the equalizing current (block 702), and monitoring a state of charge of the lower battery 250-1 and the upper battery 250-2 (block 704). Optionally, the equalizer current measurement may be filtered (block 706).

The EMU 220 determines if the equalizing current is saturated (block 708), and if so, proceeds to determine if a timer has been started (block 710). If the timer has not been started yet, the EMU may start a timer (block 716) and then continue to monitor the equalizing current. If the timer has already been started, operations proceed to block 712, where the EMU determines if the timer has exceeded a threshold, Timer_Threshold (block 712). If the timer has exceeded the threshold, the EMU 220 may take remedial action (block 714), such as by reducing the level of 12V current supplied at the positive terminal of the lower battery 250-1. If the timer has not yet exceeded the threshold, operations return to block 702 for the EMU 220 to continue to monitor the equalizing current. In these embodiments, the EMU 220 may not take remedial action until the equalizing current has been determined to be saturated for at least a threshold amount of time. That is, according to one aspect, the EMU 220 may a length of time for which the equalizing current is saturated, and remedial action, such as reducing the level of 12V current supplied at the positive terminal of the first 12V battery, may be additionally performed based on the length of time for which the equalizing current is saturated.

In some embodiments, the equalizer 230 may provide an equalizer diagnostic signal that includes the level of the equalizing current.

As shown in FIG. 2, a vehicle electrical system typically includes an alternator 135 that is configured to supply a charging current at a positive terminal of the upper battery 250-2. In some embodiments, the EMU 220 may determine that the alternator 135 is currently supplying charging current to the upper battery 250-2, and may, if the equalizing current is saturated, reduce a voltage output by the alternator 135 to the positive terminal of the upper battery 250-2.

According some embodiments, the equalizer monitoring unit 220 may monitor a level of the equalizing current supplied to the positive terminal of the lower battery, determine, based on monitoring of the level of the equalizing current, that the equalizing current is saturated and that at least one of (a) a state of charge of the first 12V battery is below a first threshold or (b) a difference in state of charge of the first 12V battery and the second 12V battery is greater than a second threshold, and reduce a level of 12V current supplied to the 12V subsystem at the positive terminal of the first 12V battery in response to the determination.

Figure 8:
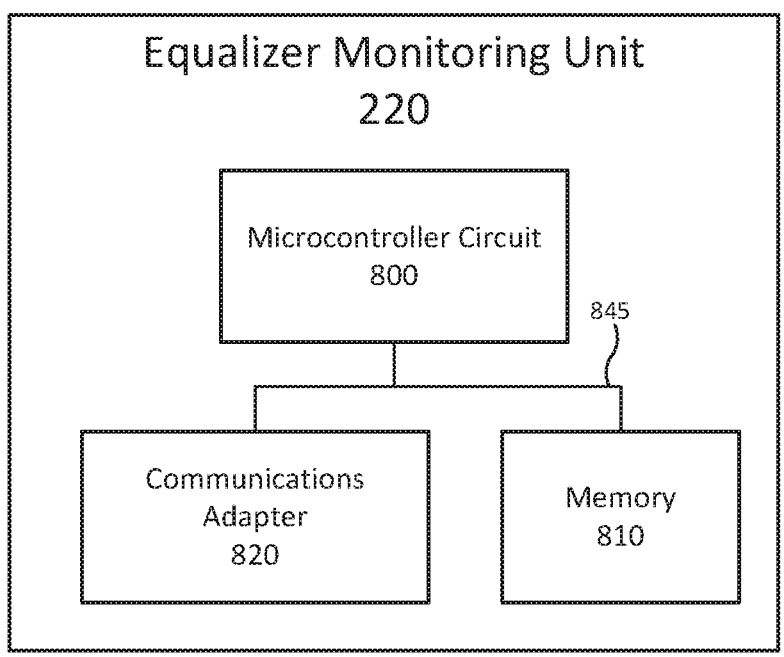
FIG. 8 is a block diagram of an equalizer monitoring unit according to some embodiments.
Figure 9A:
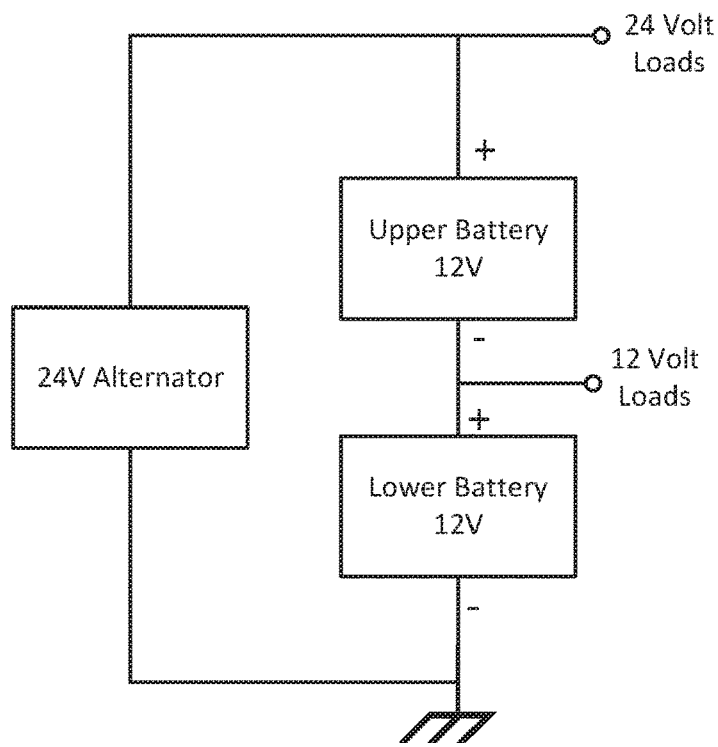
FIGS. 9A and 9B are block diagrams illustrating conventional components of dual voltage vehicle electrical systems.
Figure 9B:
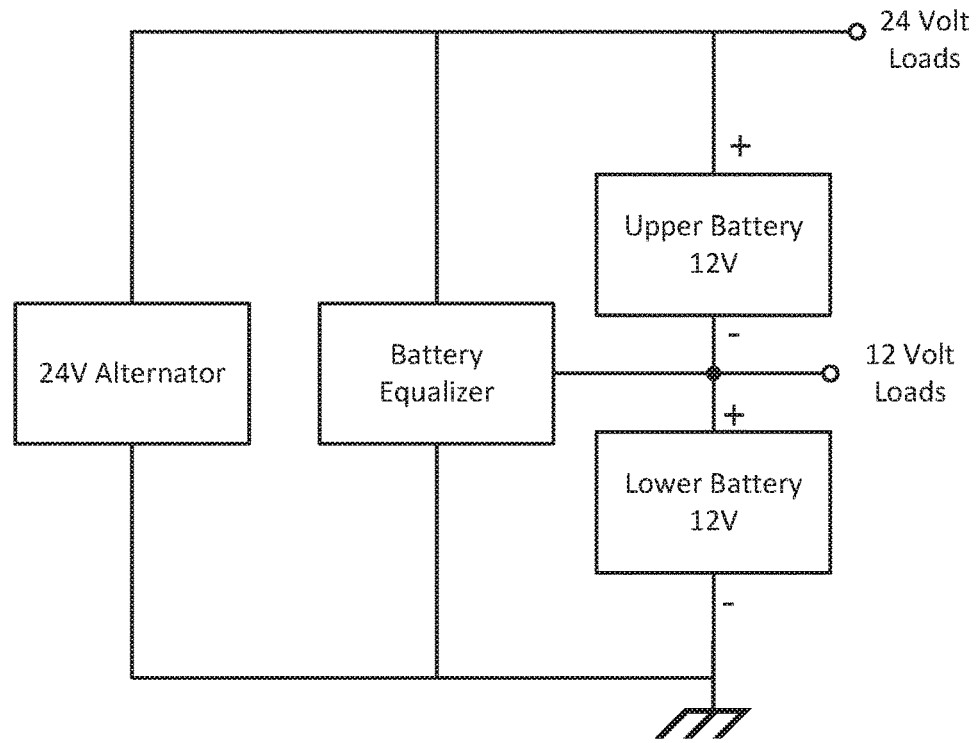

FIG. 8 is a block diagram of an equalizer monitoring unit 220 according to some embodiments. As shown in FIG. 8, the equalizer monitoring unit 220 is an electrical control unit including a microcontroller circuit 800. The EMU 220 includes a memory 810 and a communications adapter 820 connected to the microcontroller circuit 800, for example, through a system bus 845. The microcontroller circuit 800 may be any suitable programmable controller, such as a 16-bit or 32-bit PIC microcontroller manufactured by Microchip Technology Inc. of Chandler, Ariz. that is capable of perform operations described above, such as monitoring a level of the equalizing current, determining that the equalizing current is saturated, etc. The communication adapter 820 may be a serial communication chip, such as a UART chip that enables serial communication with the equalizer 230, the power switch 235, and/or other parts of the vehicle electrical system 100. The memory 810 may be separate from the microcontroller circuit 800 or included on-board the microcontroller circuit, and may include random access memory (RAM), read-only memory (ROM), flash memory, cache memory, or any other type of memory that stores instructions and/or data for use by the microcontroller circuit 800. The memory 810 may contain functional modules of instructions that configure the EMU 220 to perform the operations described herein.

Various embodiments are described herein by way of non-limiting examples in the context of a dual voltage vehicle electrical system. It is to be understood that the embodiments are not limited to the particular configurations disclosed herein.

When an element is referred to as being "connected", "coupled", "responsive", "mounted", or variants thereof to another element, it can be directly connected, coupled, responsive, or mounted to the other element or intervening elements may be present. In contrast, when an element is referred to as being "directly connected", "directly coupled", "directly responsive", "directly mounted" or variants thereof to another element, there are no intervening elements present. Like numbers refer to like elements throughout. As used herein, the singular forms "a", "an" and "the" are intended to include the plural forms as well, unless the context clearly indicates otherwise. Well-known functions or constructions may not be described in detail for brevity and/or clarity. The term "and/or" and its abbreviation "/" include any and all combinations of one or more of the associated listed items.

It will be understood that although the terms first, second, third, etc. may be used herein to describe various elements/ operations, these elements/operations should not be limited by these terms. These terms are only used to distinguish one element/operation from another element/operation. Thus, a first element/operation in some embodiments could be termed a second element/operation in other embodiments without departing from the teachings of present inventive concepts. The same reference numerals or the same reference designators denote the same or similar elements throughout the specification.

As used herein, the terms "comprise", "comprising", "comprises", "include", "including", "includes", "have", "has", "having", or variants thereof are open-ended, and include one or more stated features, integers, elements, steps, components or functions but do not preclude the presence or addition of one or more other features, integers, elements, steps, components, functions or groups thereof. Furthermore, as used herein, the common abbreviation "e.g.", which derives from the Latin phrase "exempli gratia," may be used to introduce or specify a general example or examples of a previously mentioned item, and is not intended to be limiting of such item. The common abbreviation "i.e.", which derives from the Latin phrase "id est," may be used to specify a particular item from a more general recitation.

Persons skilled in the art will recognize that certain elements of the above-described embodiments may variously be combined or eliminated to create further embodiments, and such further embodiments fall within the scope and teachings of inventive concepts. It will also be apparent to those of ordinary skill in the art that the above-described embodiments may be combined in whole or in part to create additional embodiments within the scope and teachings of inventive concepts. Thus, although specific embodiments of, and examples for, inventive concepts are described herein for illustrative purposes, various equivalent modifications are possible within the scope of inventive concepts, as those skilled in the relevant art will recognize. Accordingly, the scope of inventive concepts is determined from the appended claims and equivalents thereof.

The invention claimed is:

1. A method of operating an electrical system including a first 12V battery, a second 12V battery coupled in series with the first 12V battery, and a battery equalizer coupled to the first 12V battery and the second 12V battery and configured to supply an equalizing current to the first 12V battery, the method comprising:
monitoring a level of the equalizing current;
determining, based on monitoring of the level of the equalizing current, that the equalizing current is saturated; and
reducing a level of 12V current supplied to a load at a positive terminal of the first 12V battery in response to determining that the equalizing current is saturated.

2. The method of claim 1, further comprising:
monitoring a state of charge of the first 12V battery; and
determining that the state of charge of the first 12V battery is below a threshold charge level; and
wherein reducing the level of 12V current supplied to the load at the positive terminal of the first 12V battery is performed in response to determining that the equalizing current is saturated and that the state of charge of the first 12V battery is below the threshold charge level.

3. The method of claim 1, further comprising:
determining a length of time for which the equalizing current is saturated;
wherein reducing the level of 12V current supplied to the load at the positive terminal of the first 12V battery is additionally performed based on the length of time for which the equalizing current is saturated.

4. The method of claim 1, further comprising:
receiving an equalizer diagnostic signal from the battery equalizer;
wherein the equalizer diagnostic signal provides the level of the equalizing current.

5. The method of claim 1, wherein reducing the level of 12V current supplied to the load at the positive terminal of the first 12V battery comprises disabling at least one 12V system powered by the electrical system.

6. The method of claim 1, further comprising:
filtering the level of the equalizing current before determining that the equalizing current is saturated.

7. The method of claim 1, wherein the electrical system further comprises an alternator configured to supply a charging current at a positive terminal of the second 12V battery, the method further comprising:
determining that the alternator is currently supplying charging current to the second 12V battery; and
controlling a voltage output by the alternator to the positive terminal of the second 12V battery in response to determining that the equalizing current is saturated.

8. The method of claim 1, further comprising:
monitoring a state of charge of the first 12V battery;
determining a difference in state of charge between the first 12V battery and the second 12V battery; and
determining if the difference in state of charge between the first 12V battery and the second 12V battery is greater than a threshold state of charge difference;
wherein reducing the level of 12V current supplied to the load at the positive terminal of the first 12V battery is performed in response to determining that the difference in state of charge between the first 12V battery and the second 12V battery is greater than the threshold state of charge difference.

9. The method of claim 8, further comprising:
measuring a temperature of the first 12V battery and/or a temperature of the second 12V battery; and
setting the threshold state of charge difference based on the temperature of the first 12V battery and/or a temperature of the second 12V battery.

10. A vehicle electrical system, comprising:
a first 12V battery;
a second 12V battery coupled in series with the first 12V battery;
a battery equalizer coupled to the first 12V battery and the second 12V battery, wherein the battery equalizer is configured to supply an equalizing current to the first 12V battery; and
an electrical control unit comprising a controller programmed to perform operations including:
monitoring a level of the equalizing current;
determining, based on monitoring of the level of the equalizing current, that the equalizing current is saturated; and
reducing a level of 12V current supplied at a positive terminal of the first 12V battery in response to determining that the equalizing current is saturated.

11. The vehicle electrical system of claim 10, wherein the controller is further programmed to perform operations including:
monitoring a state of charge of the first 12V battery; and
determining that the state of charge of the first 12V battery is below a threshold charge level; and
wherein reducing the level of 12V current supplied at the positive terminal of the first 12V battery is performed in response to determining that the equalizing current is saturated and that the state of charge of the first 12V battery is below the threshold charge level.

12. The vehicle electrical system of claim 10, wherein the controller is further programmed to perform operations including:
determining a length of time for which the equalizing current is saturated;
wherein reducing the level of 12V current supplied to a load at the positive terminal of the first 12V battery is additionally performed based on the length of time for which the equalizing current is saturated.

13. The vehicle electrical system of claim 10, wherein the controller is further programmed to perform operations including:
receiving an equalizer diagnostic signal from the battery equalizer;
wherein the equalizer diagnostic signal provides the level of the equalizing current.

14. The vehicle electrical system of claim 10, wherein reducing the level of 12V current supplied at the positive terminal of the first 12V battery comprises disabling at least one 12V system powered by the electrical system.

15. The vehicle electrical system of claim 10, wherein the controller is further programmed to perform operations including:
   filtering the level of the equalizing current before determining that the equalizing current is saturated.

16. The vehicle electrical system of claim 10, further comprising:
   an alternator configured to supply a charging current at a positive terminal of the second 12V battery; and
   wherein the controller is further programmed to perform operations including:
   determining that the alternator is currently supplying charging current to the second 12V battery; and
   controlling a voltage output by the alternator to the positive terminal of the second 12V battery in response to determining that the equalizing current is saturated.

17. The vehicle electrical system of claim 10, wherein the controller is further programmed to perform operations including:
   monitoring a state of charge of the first 12V battery;
   determining a difference in state of charge between the first 12V battery and the second 12V battery; and
   determining if the difference in state of charge between the first 12V battery and the second 12V battery is greater than a threshold state of charge difference;
   wherein reducing the level of 12V current supplied at the positive terminal of the first 12V battery is performed in response to determining that the difference in state of charge between the first 12V battery and the second 12V battery is greater than the threshold state of charge difference.

18. The vehicle electrical system of claim 17, wherein the controller is further programmed to perform operations including:
   measuring a temperature of the first 12V battery and/or a temperature of the second 12V battery; and
   setting the threshold state of charge difference based on the temperature of the first 12V battery and/or a temperature of the second 12V battery.

19. A vehicle electrical system, comprising:
   a first 12V battery having a positive terminal and a negative terminal and configured to supply power to a 12V subsystem of a vehicle from the positive terminal of the first 12V battery;
   a second 12V battery having a negative terminal coupled to the positive terminal of the first 12V battery and having a positive terminal and being configured, in combination with the first 12V battery, to supply power to a 24V subsystem of the vehicle from the positive terminal of the second 12V battery;
   a battery equalizer coupled to the positive terminal and negative terminal of the first 12V battery and to the positive terminal and negative terminal of the second 12V battery, wherein the battery equalizer is configured to supply an equalizing current to the positive terminal of the first 12V battery in response to detecting a charge imbalance between the first 12V battery and the second 12V battery; and
   an electrical control unit comprising a microcontroller programmed to perform operations including:
   monitoring a level of the equalizing current supplied to the positive terminal of the first 12V battery;
   determining, based on monitoring of the level of the equalizing current, that the equalizing current is saturated and that at least one of (a) a state of charge of the first 12V battery is below a first threshold or (b) a difference in state of charge of the first 12V battery and the second 12V battery is greater than a second threshold; and
   reducing a level of 12V current supplied to the 12V subsystem at the positive terminal of the first 12V battery in response to the determination.

* * * * *